United States Patent [19]

Shima et al.

[11] Patent Number: 4,957,712
[45] Date of Patent: Sep. 18, 1990

[54] APPARATUS FOR MANUFACTURING SINGLE SILICON CRYSTAL

[75] Inventors: Yoshinobu Shima; Masanori Ohmura; Akira Ohtani; Kenji Araki, all of Tokyo, Japan

[73] Assignee: NKK Corporation, Tokyo, Japan

[21] Appl. No.: 457,322

[22] Filed: Dec. 27, 1989

[30] Foreign Application Priority Data

May 30, 1989 [JP] Japan .................. 1-136448

[51] Int. Cl.$^5$ .............................................. C30B 35/00
[52] U.S. Cl. .................................................. 422/249
[58] Field of Search ......... 156/617.1, 620.4, DIG. 64; 422/249

[56] References Cited

U.S. PATENT DOCUMENTS

| | | | |
|---|---|---|---|
| 4,028,058 | 6/1977 | Beinert et al. | 156/620.4 |
| 4,028,137 | 6/1977 | Ellbrunner et al. | 156/620.4 |
| 4,242,553 | 12/1980 | Berkman et al. | 422/249 |
| 4,330,362 | 5/1982 | Zulehner | 422/249 |
| 4,847,053 | 7/1989 | Pastor et al. | 422/249 |

FOREIGN PATENT DOCUMENTS 0293865 12/1988 European Pat. Off. .
58-130195 8/1983 Japan .
59-141578 9/1984 Japan .
63-95195 4/1988 Japan .

Primary Examiner—Olik Chaudhuri
Assistant Examiner—Felisia Garrett-Meza
Attorney, Agent, or Firm—Frishauf, Holtz, Goodman & Woodward

[57] ABSTRACT

An apparatus for manufacturing a single silicon crystal comprises a quartz crucible accomodated into a graphite crucible, a partition member partitioning molten silicon material in the quartz crucible into a single silicon growing portion on the inner side and a material melting portion on the outer side, a heater for maintaining the molten silicon material in the single silicon growing portion at a temperature appropriate for growing the single silicon crystal and for supplying heat for melting the raw materials fed into the material melting portion, and small holes made in the partition member. The partition member is made of an opaque quartz glass. The material melting portion is replenished with the raw materials and single silicon crystal is pulled from the single silicon growing portion. Molton silicon material moves from the material melting portion into the single silicon growing portion through small holes made in the partition member.

9 Claims, 2 Drawing Sheets

APPARATUS FOR MANUFACTURING SINGLE SILICON CRYSTAL

BACKGROUND OF THE INVENTION

1. Field of the Invention

The present invention relates to an apparatus for manufacturing a single silicon crystal by the use of the Czochralski process, and more particularly, to an apparatus for pulling a single silicon crystal while continuously feeding silicon materials.

2. Description of the Prior Arts

A method for pulling a single silicon crystal by the use of the Czochralski process has previously been used and this method is a substantially completed technique. However, the yield of wafers being able to stand their use can be 50% or less due to maldistribution of dopants and oxygen in case requirements of components are severe.

As an effective method for solving the foregoing problem, there is known a method wherein a liquid surface of molten materials is maintained at a predetermined level by continuously or intermittently replenishing a crucible with silicon material. Particularly recently, high-quality granular polycrystal silicon has come to be able to be manufactured, and several inventions wherein this high-quality granular polycrystal silicon is used are disclosed. Those inventions are, for example, disclosed in Japanese Patent Publications Laid Open No. 130195/83 and No. 95195/88 and in Japanese Utility Model Publication Laid Open No. 141578/84.

Only one or two examples of having manufactured single silicon crystal of a small diameter are seen in the method for manufacturing a single silicon crystal by the use of the foregoing method, but micro defects or the like in the single silicon crystal are not described.

It is understood that there are the following problems in the prior art apparatus for pulling a single silicon crystal while continuously and directly replenishing a crucible with granular silicon when there is used a transparent quartz glass usually used for manufacturing semiconductor materials as a partition member partitioning molten silicon materials in the crucible into a single crystal growing portion on the inner side and a material melting portion on the outer side.

(1) Even though a single silicon crystal is made to grow rapidly so that micro defects can be hard to be incorporated into the single silicon crystal, there occur a great amount of oxidation-induced stacking faults (OSF) in comparison with the conventional Czochralski process.

(2) A vibration of the surface of molten silicon is large and this hinders crystallization of the molten silicon.

SUMMARY OF THE INVENTION

It is an object of the present invention to provide an apparatus for manufacturing a single silicon crystal wherein, in an apparatus for manufacturing a single silicon crystal in which a crucible having molten materials therein is continuously replenished with granular or lumpish materials, charged materials are steadily melted without hindering a growth of the single silicon crystal and the single silicon crystal having a substantially constant concentration of dopant and oxygen in the direction of pulling of the single silicon crystal, without any micro defects in the single silicon crystal.

To accomplish the above-mentioned object, the present invention provides an apparatus for manufacturing a single silicon crystal comprising:

a quartz crucible accomodated into a graphite crucible, molten silicon being in said quartz crucible;

a partition member partitioning molten silicon material in said quartz crucible into a single silicon growing portion on the inner side and a material melting portion on the other side, said material melting portion being replenished with granular silicon and a single silicon crystal being pulled from said single silicon crystal growing portion;

a heater for maintaining said molten silicon material in the single silicon growing portion at a temperature appropriate for growing the single silicon crystal and for supplying heat for melting said granular silicon fed into said material melting portion, said heater being arranged to surround said graphite crucible;

small holes made in said partition member, said molten silicon material moving from said material melting portion to said single silicon growing portion through said small holes; and opaque quartz glass, which said partition member is made of.

The above objects and other objects and advantages of the present invention will become apparent from the detailed description which follows, taken in conjunction with the appended drawings.

DESCRIPTION OF THE PREFERRED EMBODIMENT

In the apparatus of the present invention, firstly, the material melting portion is maintained at a high temperature so that granular silicon material can be sufficiently melted and the single silicon growing portion on the inner side is maintained at a temperature just above a melting point of silicon. In the foregoing state, the material melting portion is replenished with an amount of granular material corresponding to an amount of pulled crystal. The silicon material melted in the material melting portion flows into the single silicon growing portion through small holes made in the partition member. In the present invention, an opaque quartz glass is used for the partition member. Densities of the oxidation-induced stacking faults in the single silicon crystal grown in the single silicon growing portion on the inner side are decreased with the use of the opaque quartz glass. The vibration of the surface of molten silicon is decreased and a hindrance to single crystallization of silicon is removed. A visible ray permeability of the opaque quartz glass is desired to be 0% or more and 50% or less.

A decrease of the densities of the oxidation-induced stacking faults and of the vibration of the surface of molten silicon seems to relate to the fact that a ray of light and a ray of heat are prevented from passing through the partition member due to opaqueness of the partition member. That is, it is thought that a radiation and an input of heat in a portion where a molten silicon liquid contacts quartz glass are stabilized and a fluctuation of wettability is decreased.

An opaque quartz glass is used as the partition member. A glass, which is made opaque by forming small irregularities on the surface of the glass, can be used. In this case, a roughness of the irregularities is desired to be 50 to 2000 μm RMS. RMS means a root mean square value. The irregularities of said quartz glass can be formed by causing particles of a quartz glass to deposit on the surface of the quartz glass.

In this case, three sorts of the following opaque quartz glasses are used:

(a) An opaque glass having irregularities on the surface thereof on the side of the material melting portion;

(b) An opaque glass having irregularities on the surface thereof on the side of the single crystal growing portion; and (c) An opaque glass having irregularities on both surfaces thereof on the side of the material melting portion and single crystal growing portion.

The opaque glass (a) is most desirable among said three sorts of the opaque glasses since there is no possibility of separation of quartz glass fragments from the surface of the the partition member on the side of the single silicon growing portion.

The opaqueness of the partition member is required during the growth of the single crystal. That is, a glass, which is transparent before its use and which becomes opaque at the time of its use, can be used. Then, the effect of the present invention is produced.

Figure 1:
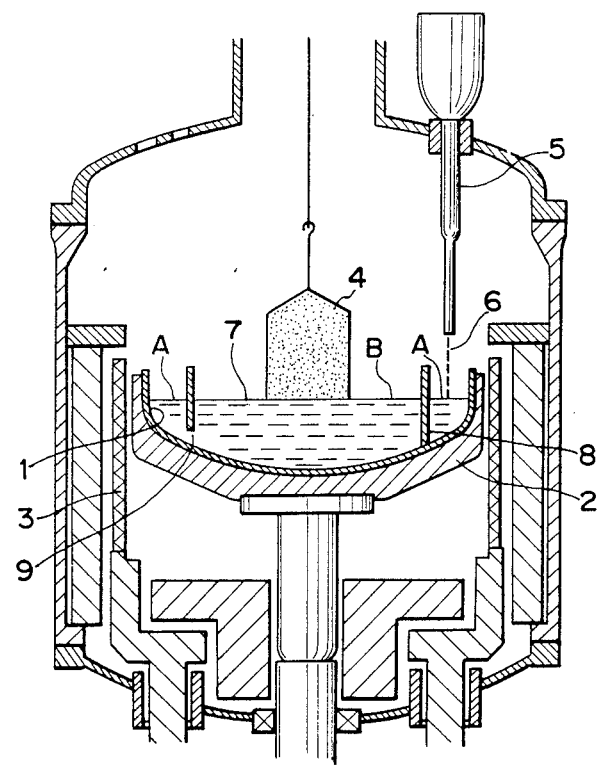
FIG. 1 is a vertical sectional view schematically illustrating an apparatus for manufacturing a single silicon crystal in an example of the present invention.

FIG. 1 is a vertical sectional view schematically illustrating an example of the present invention. In the drawings, reference numeral 1 denotes a quartz crucible which is accommodated into graphite crucible 2. Reference numeral 7 denotes molten materials put into the quartz crucible 1, from which a single silicon crystal 4 grown into a pillar is pulled. Reference numeral 3 denotes a heater surrounding the graphite crucible 2. The above-described apparatus is fundamentally the same as the apparatus for manufacturing a single silicon crystal by the use of the ordinary "Czochralski process". Granular material 6 is fed from material feeding apparatus 5 into a material melting portion A.

Reference numeral 8 denotes a partition member which is made of an opaque quartz glass and which is positioned concentrically with the crucible 1 in the crucible 1. Small holes 9 are made in the partition member 8. Molten materials in the material molten portion A flow into the single crystal growing portion through the small holes 9. A lower edge portion of the partition member 8 is previously fused with the crucible 1 or fused with the crucible under the influence of heat produced by melting of the silicon material. High-temperature molten materials in the material melting poriton A flow into the single crystal growing portion B through only the small holes 9.

Figure 2:
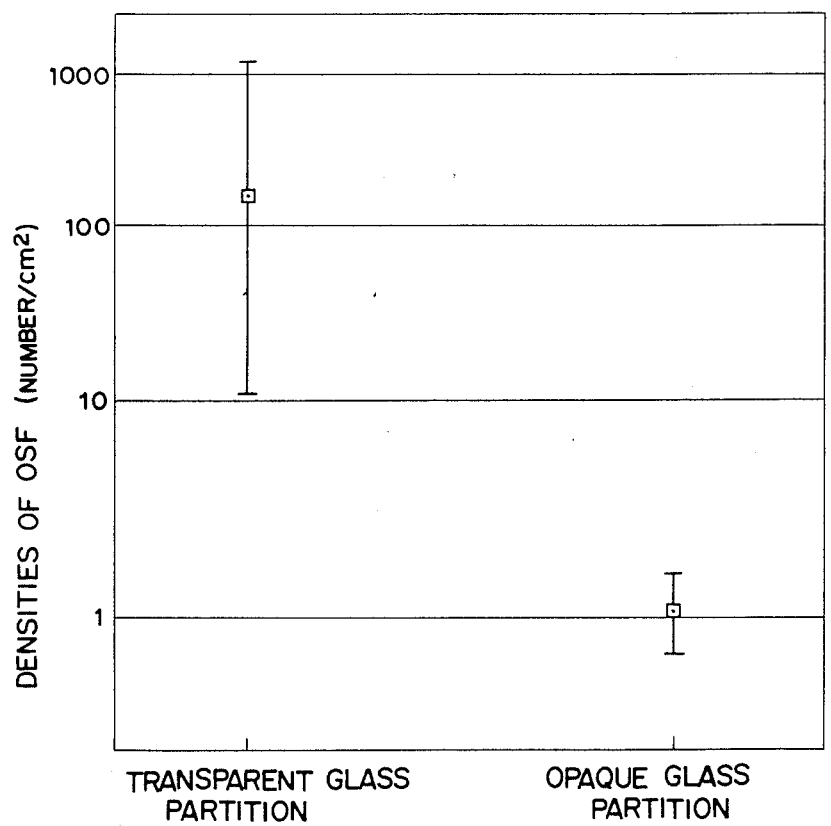
FIG. 2 is a graphical representation indicating a comparison of densities of oxidation-induced stacking faults (OSF) in the case of using an opaque quartz glass for a partition member and in the case of using a transparent quartz glass for the partition member pertinent to the present invention

FIG. 2 is a graphical representation showing a comparison of densities of the oxidation-induced stacking faults (OSF) in the case of the use of the opaque quartz glass and in the case of the use of the transparent quartz glass. It is understood that the densities of the oxidation-induced stacking faults are apparently decreased in the case of the use of the opaque quartz glass.

As described above, according to the present invention, in an apparatus for manufacturing a single silicon crystal which comprises a crucible having molten silicon material therein and a partition member partitioning said molten silicon material into a single silicon growing portion on the inner side and a material melting portion on the outer side, since said partition member is made of an opaque quartz glass, oxidation-induced stacking faults due to a fluctuation of temperatures and a hindrance to a single crystallization are prevented.

What is claimed is:

1. An apparatus for manufacturing a single silicon crystal comprising:

a quartz crucible accomodated into a graphite crucible, molten silicon being in said quartz crucible;

a partition member partitioning molten silicon material in said quartz crucible into a single silicon growing portion on the inner side and a material melting portion on the outer side, said material melting portion being replenished with raw materials and a single silicon crystal being pulled from said single silicon crystal growing portion;

a heater for maintaining said molten silicon material in the single silicon growing portion at a temperature appropriate for growing the single silicon crystal and for supplying heat for melting said raw materials fed into said material melting portion, said heater being arranged to surround said graphite crucible;

small holes made in said partition member, said molten silicon material moving from said material melting portion to said single silicon growing portion through said small holes; and opaque quartz glass, which said partition member is made of.

2. The apparatus of claim 1, wherein said opaque quartz glass has a visible ray permeability of 0 to 50%.

3. The apparatus of claim 1, wherein said opaque quartz glass is a quartz glass made opaque by forming irregularities of 50 to 2000 μm RMS in roughness on a surface of the side of the material melting portion.

4. The apparatus of claim 3, wherein said irregularities of the quartz glass are formed by causing particles of a quartz glass to deposit on the surface of the quartz glass.

5. The apparatus of claim 1, wherein said opauqe quartz glass is a quartz glass made opaque by forming irregularities of 50 to 2000 μm RMS in roughness on the surface of the side of the single crystal growing portion.

6. The apparatus of claim 5, wherein said irregularities of the quartz glass are formed by causing particles of a quartz glass to deposit on the surface of the quartz glass.

7. The apparatus of claim 1, wherein said opaque quartz glass is a quartz glass made opaque by forming irregularities of 50 to 2000 μm in roughness on both of the surface of the side of the material melting portion and the surface of the side of the single silicon growing portion.

8. The apparatus of claim 7, wherein said irregularities of the quartz glass are formed by causing particles of a quartz glass to deposit on the surface of the quartz glass.

9. The apparatus of claim 1, wherein
said quartz glass partition member is made opaque by forming irregularities of 50 to 2000 μm RMS in roughness on the surface thereof on the side of the material melting portion; and
said partition member has a visible ray permeability of 0 to 50%.

* * * * *